United States Patent

Chakravorty et al.

Patent Number: 5,124,238
Date of Patent: Jun. 23, 1992

[54] FABRICATION OF MICROELECTRONICS USING PHOTOSENSITIVE POLYIMIDES

[75] Inventors: Kishore K. Chakravorty, Mercer Island; Chung-Ping Chien, Redmond, both of Wash.

[73] Assignee: The Boeing Company, Seattle, Wash.

[21] Appl. No.: 631,194

[22] Filed: Dec. 20, 1990

Related U.S. Application Data

[63] Continuation of Ser. No. 241,693, Sep. 6, 1988, abandoned.

[51] Int. Cl.$^5$ ................................................ G03C 5/00
[52] U.S. Cl. ..................................... 430/330; 430/315; 430/318; 430/329
[58] Field of Search ................. 430/330, 315, 318, 329

[56] References Cited

U.S. PATENT DOCUMENTS

| | | | |
|---|---|---|---|
| 4,661,214 | 4/1987 | Young | 204/15 |
| 4,681,778 | 7/1987 | Young | 427/96 |
| 4,696,890 | 9/1987 | Pfeifer | 430/325 |
| 4,741,988 | 5/1988 | Vander Zande et al. | 430/330 |
| 4,770,897 | 9/1988 | Wu | 430/329 |
| 4,855,871 | 8/1989 | Young | 361/411 |

OTHER PUBLICATIONS

Rubner et al., "A Photopolymer—The Direct Way to Polyimide Patterns", *Photographic Science and Engineering*, vol. 23, No. 5, Sep.-Oct. 1979, pp. 303-309.

Cech et al., "Photoimageable polyimide: dielectric material for high aspect ratio structures", Reprinted from the Proceedings of SPIE—The International Society for Optical Engineering, vol. 631, Advances in Resist Technology and Processing II, Mar. 10-11, 1986.

Moriya, K., et al., High-density multilayer interconnection with photo-sensitive polyimide dielectric and electroplating conductor, Proceedings 34th Electronic Component Conference, IEEE, pp. 82-87, 1984.

Endo, A., et al., Material and processing technologies of polyimide for advanced electronic devices, J. Electrochem. Soc.: Solid State Science and Technology, 134(10):2522-2527, Oct. 1987.

Pfeifer, J. and Rohde, O., Direct photoimaging of fully imidized solvent-soluble polyimides, Second International Conference on Polyimides, Mid-Hudson Section SPE, Oct. 30-Nov. 1, 1985, Ellenville, N.Y.

*Primary Examiner*—Ellis P. Robinson
*Assistant Examiner*—J. Weddington
*Attorney, Agent, or Firm*—Christensen, O'Connor, Johnson & Kindness

[57] ABSTRACT

A method of photolithographically patterning a layer of a dielectric composition including a photosensitive polyimide provides patterned dielectric features that have vertical wall profiles that are free of distortions normally associated with high temperature production conditions and shrinkage of the dielectric composition. The method is useful in the production of integrated circuits and high density multiconnect structures.

18 Claims, 7 Drawing Sheets

FABRICATION OF MICROELECTRONICS USING PHOTOSENSITIVE POLYIMIDES

This application is a continuation application based on prior copending application Ser. No. 07/241,693, filed on Sep. 6, 1988 now abandoned.

BACKGROUND OF THE INVENTION

The present invention relates to methods of using photosensitive polyimides as dielectrics in the fabrication of microelectronic devices.

The fabrication of integrated circuit devices and the production of high density interconnect structures utilize photolithographic patterning to provide patterned layers of a dielectric composition. Photolithographic patterning generally includes the steps of: (1) forming a layer of the dielectric composition; (2) exposing the layer to a pattern of light, such as ultraviolet light, that corresponds to the configuration of the dielectric layer desired; and (3) developing away the unexposed portions of the dielectric layer with a developing solvent in which the unexposed portions of the dielectric composition are soluble. For instance, in the fabrication of integrated circuits, photolithographic patterning of a dielectric layer is used to electroplate conductor lines onto a substrate. A layer of a dielectric composition is coated onto the substrate and is photolithographically patterned so that the portions of substrate to be electroplated are uncovered. In the production of high density interconnect structures, photolithographic patterning can be used to provide the discrete connections (i.e., vias) between vertically-spaced conductor lines that are otherwise separated by the layer of the dielectric composition.

Polyimides have been identified as a dielectric composition useful in microelectronic device fabrication because of their low relative dielectric constant, high temperature stability, and planarization properties. Several types of polyimide dielectrics are available, such as photosensitive polyimide compositions prepared from polyamic acid precursors containing photosensitizers, and solvent-soluble pre-imidized photosensitive polyimide compositions. The commercial availability of these photosensitive dielectric compositions has simplified the photolithographic patterning of these dielectrics and improved the reliability of microelectronic devices containing the patterned dielectrics. Unfortunately, the known methods of photographically patterning photosensitive polyimide dielectric compositions suffer from several limitations; for instance, prior to the present invention, methods for photolithographically patterning a layer of the photosensitive polyimide compositions frequently resulted in layers that were less than uniformly irradiated and that exhibited unsatisfactory vertical wall profiles. Also, when polyimide layers prepared from polyamic acid precursors containing photosensitizers are coated directly over metal conductor seed lines, the precursors have a tendency to chemically interact with the metals, such as copper, preventing satisfactory patterning over the underlying metal layer. Other methods of photolithographically patterning photosensitive polyimides also require that the polyimide and underlying microelectronic components be exposed to elevated baking temperatures which limits the types of materials that can be used. For example, at temperatures above about 250° C., adjacent layers of metals that form the conductor seed lines are susceptible to interdiffusion and forming brittle, intermetallic alloys.

SUMMARY OF THE INVENTION

The present invention is a process for photolithographically patterning a layer of a dielectric composition including a solvent and a photosensitive polyimide. The process includes the step of heating a layer of the dielectric composition having an initial thickness to a primary temperature effective to decrease the initial thickness of the layer by a first amount to an intermediate thickness, without affecting the susceptibility of the polyimide to solvent attack in a developing solvent. The decrease in thickness is primarily associated with the desorption of a major amount of the solvent from the layer of the dielectric composition. The layer of intermediate thickness is then irradiated with ultraviolet radiation through a mask that results in portions of the layer being exposed to the irradiation while other portions are unexposed. After the irradiation step, the unexposed portions of the layer are removed by contacting the layer with the developing solvent. The remaining portions of the dielectric composition are then heated to a secondary temperature effective to decrease the thickness of the layer by a second amount to a final thickness. The first amount is greater than the second amount so that a major amount of shrinkage occurs when the layer is heated to the primary temperature. The layer can be subsequently heated to an elevated curing temperature which cross-links the polyimide and renders its resistant to solvent attach in most solvents. Because a substantial amount of shrinkage occurs prior to exposing and developing the layer, only a minimal amount of shrinkage occurs when the layer is heated to the secondary temperature and virtually no shrinkage occurs when the layer is heated to the final curing temperature.

In a particular application, the process for photolithographically patterning a dielectric layer is used for electroplating a conductor seed pattern. When used in the context of electroplating a conductor seed pattern, the process includes the step of applying a layer of the dielectric composition over a conductor seed pattern. The layer is heated to a primary temperature effective to decrease the initial thickness of the layer by a first amount to an intermediate thickness, without affecting the susceptibility of the dielectric composition to solvent attack by a developing solvent. The layer is irradiated through a mask that prevents the portions of the dielectric composition covering the conductor seed pattern from being exposed. The unexposed portions are removed by contacting the layer with the developing solvent, and the remaining portions are heated to a secondary temperature effective to decrease the intermediate thickness of the layer by a second amount to a final thickness. The first amount is greater than the second amount so that a major amount of shrinkage occurs when the layer is heated to the primary temperature. The uncovered portions of the conductor seed pattern are then subjected to conventional electroplating conditions to provide conductive lines. As above, very little shrinkage occurs after the dielectric composition is photolithographically patterned because a major amount of the solvent is desorbed in the initial heating step.

The process of the present invention provide photolithographically patterned dielectric structures having well-defined vertical walls that are free of distortions associated with shrinkage of the photopatterned layer.

The present invention also eliminates the possibilities of any loss of photo-patterning characteristics as a consequence of chemical interaction between the dielectric composition and the underlying metal seed layers, without the use of additional layers intended as a barrier against the chemical interaction. Another advantage of the present invention relates to the lower temperatures employed compared to the elevated temperatures used in known methods of photolithographically patterning a dielectric layer. At these lower temperatures, materials that could not be used at the elevated temperatures of the prior methods can be effectively employed. Microelectric devices produced using the present invention should be more efficient and more reliable than devices produced by conventional methods.

Other objects, features and advantages of the present invention will be readily apparent from the following descriptions of certain preferred embodiments thereof, taken in conjunction with the accompanying drawings. It is understood that variations and modifications may be affected without departing from the spirit and scope of the novel concepts of the disclosure.

DETAILED DESCRIPTION OF THE INVENTION

Figure 1A:
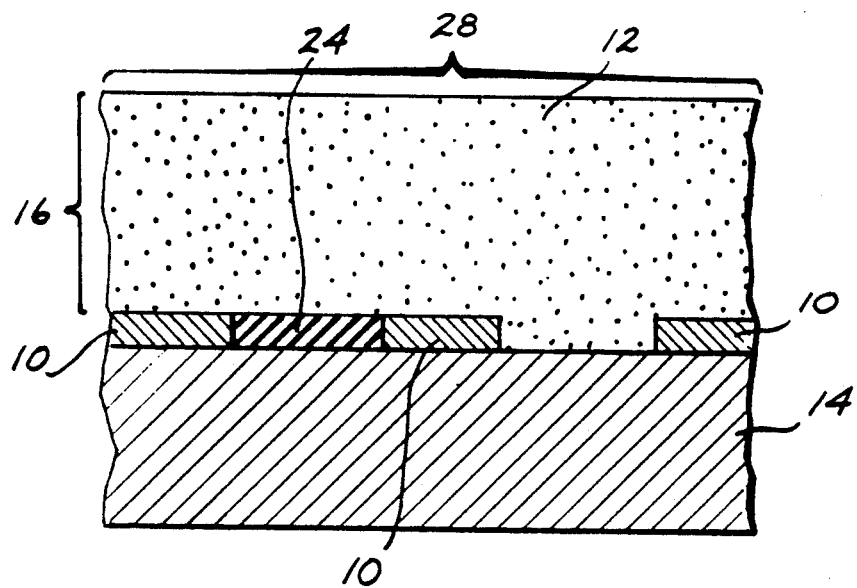
FIGS. 1a-1e schematically illustrate the steps of photolithographically patterning a layer of dielectric composition in accordance with the present invention.

FIGS. 1a through 1d illustrate the process of electroplating a conductor seed pattern, utilizing a dielectric layer patterning process in accordance with the present invention. FIG. 1a shows seed pattern 10 on the upper surface of silicon substrate 14. Conductive film 24 electrically interconnects adjacent conductor seed lines 10. Dielectric layer 12 is applied to the upper surface of the silicon substrate, so that the dielectric layer overlies seed pattern 10, conductive film 24, and exposed portions of the substrate, as illustrated in FIG. 1a. The initial thickness of dielectric layer 12 is indicated by a reference numeral 16 and the layer's lateral width is generally indicated by reference numeral 28. In a first process step, illustrated by FIG. 1b, dielectric layer 12 is heated such that the thickness of the dielectric layer 12 decreases to an intermediate thickness, indicated by reference numeral 18. In the following step, illustrated by FIG. 1c, portions of the dielectric layer 12 are exposed to radiation, and unexposed portions are removed by contacting the layer with a developing solvent. After removal of the unexposed portions, the layer 12 is heated such that the thickness of the dielectric layer 12 decreases to a final thickness, indicated by reference numeral 20 in FIG. 1d. In the next step, illustrated in FIG. 1e, conductor lines 26 are electroplated onto the conductor seed pattern 10. Because the dielectric layer 12 shrinks when the solvent is desorbed, the initial thickness 16 is greater than the desired final thickness 20.

Figure 2:
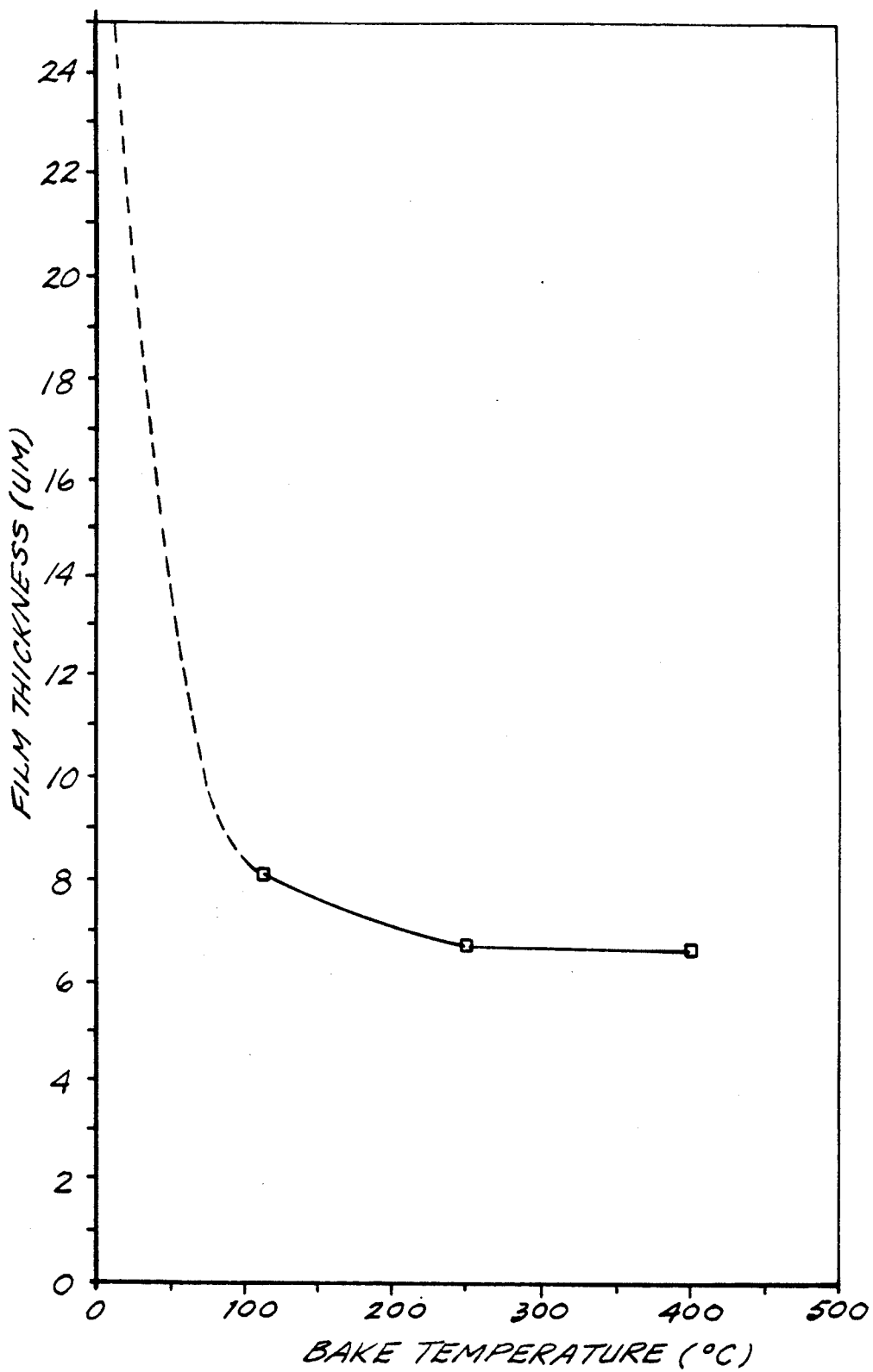
FIG. 2 graphically illustrates the decrease in thickness of a layer of a photosensitive polyimide dielectric composition as a function of temperature in accordance with the present invention.

Referring to FIG. 2, line 30 graphically shows that a large feature (2 cm×2 cm) photopatterned from a layer of the preferred photosensitive polyimide, PROBIMIDE TM 400 series available from Ciba-Geigy Corp., decreases to a final thickness of about 6.75 microns as the temperature at which the feature is baked for about 45 minutes is increased from room temperature (e.g., 20° C.) to about 350° C. Within the preferred range of temperatures for the initial baking step (i.e., 100°–130° C.), the initial thickness at room temperature (estimated in excess of 25 microns after spinning at 1500 rpms for 30 seconds) of the large feature decreases to an intermediate thickness of about 8.1 microns to about 7.8 microns. When smaller features are involved. (e.g., 10 micron wide lines) the decrease in the initial thickness of the polyimide feature measured after the photopatterning step is less compared to the decrease in the thickness for larger features. Uncontrolled shrinkage of the layer can cause the patterned features to be less than distinctly defined, i.e., uneven corners, ragged edges, etc. Also, distortion of the photopatterned layer of the dielectric composition is evidenced by the vertical profiles of the photopatterned features having walls which are not substantially vertical; that is, the upper portion of the patterned geometry is a different width than the lower portions of the patterned geometry. It will normally be necessary to observe the photopatterned layer under a microscope to evaluate these distortions and, although these distortions may be small in the abstract, their effect on the performance and reliability of microelectronics devices can be substantial.

In order to prevent adjacent layers of metal in the conductor seed layer from diffusing together and forming an intermetallic, brittle, alloy when exposed to elevated temperatures (e.g., above 250° C.), prior methods of photopatterning a dielectric layer have included an additional step of providing a diffusion barrier between the metal layers. It has been found that the diffusion barrier can be eliminated, and that other problems associated with photolithographically patterning a dielectric composition using elevated temperatures, including the distortions due to shrinkage of the photopatterned dielectric layer can be minimized by (1) desorbing a major amount of the solvent from the photosensitive polyimide dielectric composition prior to the photolithographic patterning step and (2) desorbing the solvent remaining after the photopatterning step at the lowest practical temperature. By desorbing a major amount of the solvent prior to photopatterning the layer, the thickness and lateral width of the layer is decreased a major amount before any pattern is imparted on the layer and, therefore, only a minor amount of shrinkage occurs when the layer is heated after being patterned. Although most of the shrinkage is attributable to the desorption of the solvent, a small amount of the shrinkage results from cross-linking of the polyimide in the baking steps after the layer is photopatterned. By desorbing the solvent remaining after the photopatterning step at the lowest practical temperature, the melting and interdiffusion of adjacent metal layers is minimized without requiring a diffusion barrier.

It is believed that another benefit of shrinking the layer of the dielectric composition before the photopatterning step is the effect the decreased thickness has on the attenuation of the irradiating light as it passes through the layer. By decreasing the thickness of the layer, the attenuation is reduced and a more uniform exposure of both the top and bottom of the layer is achieved. Accordingly, the resistance to solvent attack of the exposed photosensitive polyimide in the developing solvent is uniformly increased throughout the layer and, therefore, the portions of the layer remaining after removal of the unexposed portions have vertical walls (22 in FIG. 1d). The vertical wall profiles are desirable because they define the geometry of the conductor lines to be electroplated between the profiles. Conductor lines of variable widths are difficult to model or design because their variable widths make it difficult to accurately predict the impedance of the line. When the top of the conductor line is wider than the bottom of the conductor line, or vice versa, designs to prevent crosstalk between adjacent lines normally require that the narrower portions be spaced apart more than is necessary in order to accommodate for the wider portions; this results in a decrease in the number of conductor lines that can be placed on a substrate.

The method of the present invention relating to the photolithographic patterning of a layer of photosensitive polyimide and a solvent is described hereinbelow in the context of electroplating an integrated circuit or a high density interconnect structure conductor seed pattern. It should be understood that the present invention is not intended to be limited to this exemplary application.

Referring to FIG. 1a, after a conductor seed pattern 10 has been deposited and patterned on a silicon wafer 24, a layer of dielectric composition 12, including the photosensitive polyimide and solvent, is applied to the conductor seed pattern by conventional means, such as spin coating. The spin coating results in a uniform layer of dielectric composition having an initial thickness in the range of 5 to about 40 microns and a substantially planar upper surface. Because the dielectric composition is coated over a substantially planar substrate free of any features exhibiting a high aspect ratio (i.e., height:width), a planar upper surface can be provided without the need for coating the surface numerous times to provide a planar surface. The planarity of the upper surface is important, particularly in multilayer high density interconnect structures, where the upper surface of the dielectric composition may form the base upon which another layer of a dielectric composition and conductive lines can be supported. Additionally, a planar upper surface provides a dielectric layer of constant thickness, which is desired because the impedance of the conductive lines is a function of the thickness of the dielectric layer.

Figure 1B:
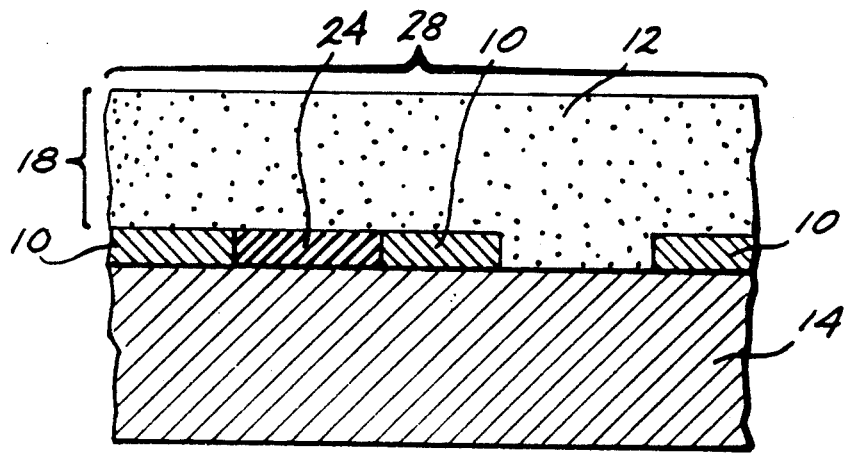

In order to reduce the degree of distortion resulting from shrinkage of the photopatterned dielectric composition, it has been found advantageous to decrease the initial thickness 16 and lateral width 28 of the layer, a first amount, down to an intermediate dimension 18, prior to the photopatterning step. Referring to FIG. 1b, by heating the layer 12 prior to the photopatterning step, a major amount of the solvent is desorbed from the dielectric composition 12, resulting in a shrinkage of the layer. Generally, the layer should be heated to a primary temperature effective to desorb enough solvent so the decrease in the initial thickness 16 of the layer 12, to its intermediate thickness 18, is at least 80 percent of the difference between the initial thickness 16 and the final thickness 20 in FIG. 1d. Although the decrease in the thickness 16 of the layer is illustrated by FIGS. 1a and 1b, it should be understood that the lateral width 28 of the layer also decreases, because FIGS. 1a and 1b represent a section of the layer whose lateral boundaries are not shown, the decrease in the lateral width is not illustrated by FIGS. 1a and 1b. The least amount of distortion due to shrinkage is observed when at least 90 percent of the total decrease in thickness occurs prior to the photopatterning step. The final thickness 20 of the layer 12 means the thickness of the layer after it has been heated to the secondary temperature. When the preferred photosensitive polyimide (PROBIMIDE TM 400 Series) is used, the preferred decrease in thickness is achieved when the layer is heated for about 30 to about 60 minutes at a primary temperature in the range of about 80° C. to about 130° C., preferably in the range of about 100° C. to about 130° C. The upper end of the temperature range at which the layer can be heated prior to the photopatterning step is limited only to those temperatures which cause the photosensitive polyimide to become resistant to solvent attack by the developing solvents. If the layer is heated above these temperatures and accordingly, rendered resistant to solvent attack with respect to the developing solvent, the layer cannot be effectively photolithographically patterned because the developing solvent will be unable to selectively dissolve the unexposed portions of the dielectric layer. Because a major amount of the shrinkage occurs before the photopatterning step in the present invention, the shrinkage, and accordingly, the distortion of the photopatterned layer after the photopatterning step is minimized.

Figure 1C:
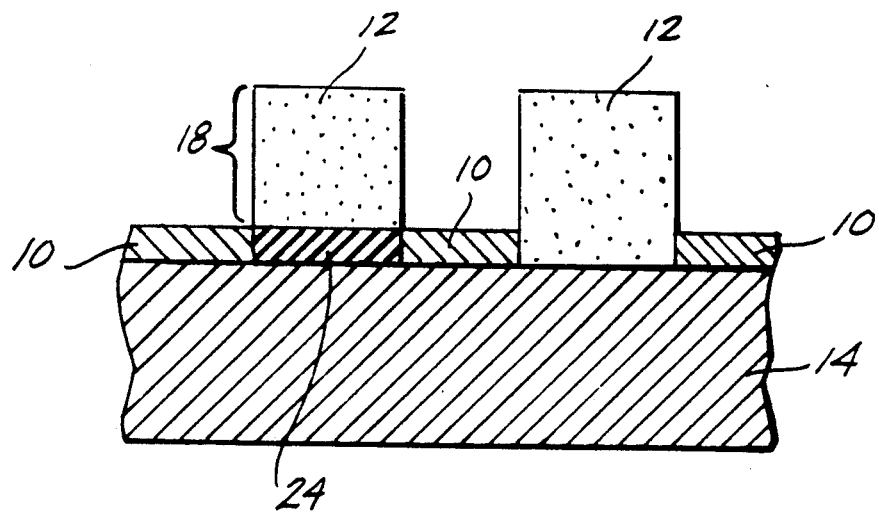

Referring back to FIG. 1b, after the initial baking step, the layer 12 of the dielectric composition is photolithographically patterned so that the portions of the conductor seed lines 10 to be electroplated are uncovered in FIG. 1c. Photolithographic patterning normally includes the steps of:

1. Irradiating the layer of the dielectric composition through a mask that exposes portions of the layer which are to remain after the developing step. When electroplating conductor seed lines, the exposed portions of the layer of the dielectric composition will generally correspond to those portions of the substrate that are not to be electroplated and also any conductive films that have been provided to electrically connect adjacent conductor seed lines.

2. Removing the unexposed portions of the dielectric layer by contacting them with the developing solvent.

The irradiation used to expose the layer of the dielectric composition is preferably ultraviolet radiation that is strongly absorbed by the dielectric composition, normally the radiation has a wavelength ranging between about 350 to 450 nanometers. Exposure to this type of radiation at a dose of about 1.0 Joule/cm$^2$ (measured at 365 nanometers) increases the resistance of the photosensitive polyimide to solvent attack by the developing solvent. Although the photoexposed polyimide is still susceptible to solvent attack by the developing solvent, it is believed the irradiation step, through photocrosslinking mechanism, causes the exposed portions of the photosensitive polyimide to be more resistant to solvent attack by the developing solvent compared to the resistance of the unexposed portions of the photosensitive polyimide. This difference in solvent resistance is what enables the developing solvent to remove the unexposed portions of the photosensitive polyimide while leaving the exposed portions intact. The developing solvent may be selected from solvents known to attack unexposed photosensitive polyimides, for example gamma-butyrolactone. Additional examples of developing solvents include cyclic ketones, such as cyclopentanone and cyclohexanone.

Figure 1D:
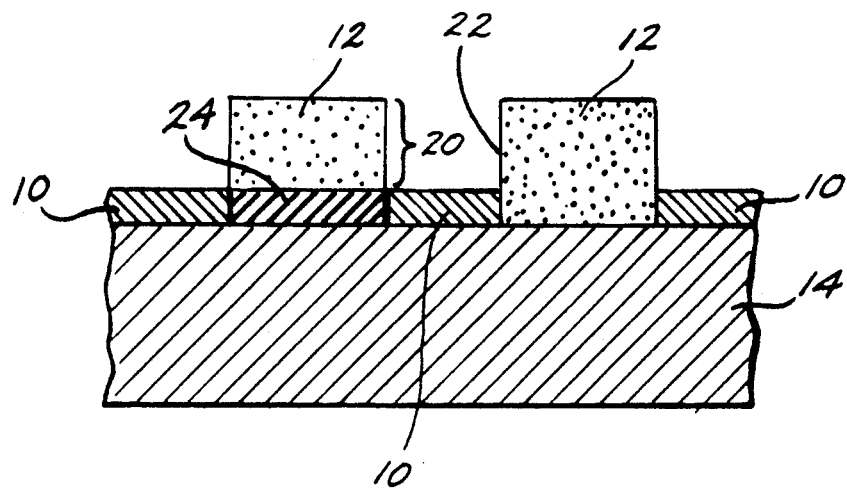

Referring to FIG. 1d, after the developing step, the photolithographically patterned layer 12 of the dielectric composition is baked at a secondary temperature to drive off the remaining solvent in the dielectric composition. Because a major amount of the shrinkage has already occurred, the shrinkage in the intermediate baking step is minimal. The decrease in thickness in this intermediate baking step should be less than about 20 percent and preferably less than 5 percent of the total difference between the initial thickness 16 of the layer and its final thickness 20. It has been found that by desorbing a first amount of the solvent which causes a significant amount of shrinkage prior to the photolithographic patterning step, the degree of distortion attributable to shrinkage after the photopatterning step is minimal. The desorption of the balance of the solvent in this intermediate baking step serves to provide a layer of the dielectric composition in a final thickness 20 and lateral width prior to the electroplating step. This baking step is carried out for about 100 minutes to about 150 minutes at temperatures ranging between about 100° C. to about 350° C., more preferably 130° C. to about 300° C., and most preferably at a temperature of between about 200° C. and 300° C.

Figure 1E:
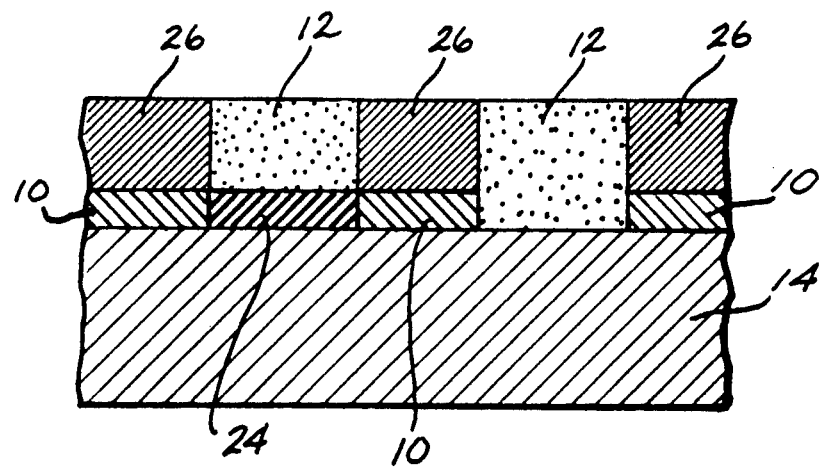

Referring to FIG. 1e, the conductor seed lines 10 that are not covered by the layer of the dielectric composition 12 are then electroplated conventionally by connecting them to a voltage source (not shown) and immersing them in an electroplating bath (not shown), containing, for example, copper ions. When the conductive films are used to electrically connect the conductor seed lines, only one connection of the conductor seed pattern to a voltage source is required.

After the electroplating step, the silicon wafer 14, including the layer of dielectric composition 12 and the electroplated conductor lines 26 can be subjected to a final heat treatment at about 350° C. to about 420° C. for about 30 minutes to about 60 minutes to complete the cross-linking of the photosensitive polyimide and render it resistant to solvent attack by most solvents. When fabricating multilayer interconnected structures, the solvent resistance of the polyimide after the second baking step is sufficient to allow further processing, e.g., adding additional layers, followed by a final heat treatment after the multiple layers are formed. The length of the final heat treatment is generally insufficient to cause interdiffusion and alloying metal layers. The final baking temperature does not result in any substantial shrinkage or associated distortion of the layer and, when necessary, serves to provide the thermal energy necessary to convert the optional heat sensitive conductive films to a dielectric. Because the dielectric composition is substantially transparent to visible radiation, it is also possible to heat the conductive films or repair portions of the circuitry using visible lasers without ablating the dielectric layer. The "disconnection" of the conductive film results in the electroplated conductor seed pattern, being electrically isolated to provide the designed circuitry in the microelectronic device.

When microelectronics, such as high density multilayer interconnect structures, are prepared in accordance with the present invention, one layer of the dielectric composition can serve as the base for another layer of the dielectric composition, including another set of conductor lines. After the conductor lines have been electroplated onto the initial conductor seed lines and before the final baking step, another layer of the dielectric composition can be provided on top of the initial layer by conventional means such as spin coating. Onto this layer can be deposited another set of conductor lines as described above. Simultaneously subjecting the overlapping layers of the dielectric composition to the final heat treatment provides a homogeneous cross-linked dielectric composition, free of any interface between the separately spin coated layers of the dielectric composition. Homogenization of the interfaces are expected to lead to better relability of the structure under thermal stressing conditions, such as thermal cycling. The absence of interfaces between overlapping layers should minimize any adhesion failure between the layers.

Polyimides usable in the present invention can be synthesized by various known methods; for example, diisocyanates can be reacted with dianhydrides, as well as their alkyl esters, to form polyimides. Another method of producing polyimides involves an amidation reaction carried out in a polar solvent to produce a high molecular weight poly(amic acid) which is then imidized by a heat treatment step. Still another method involves the reaction of dianhydrides with diamines, for example, the polymerization of pyromellitic anhydride and p-aminoaniline, It is known that certain polyimides can be rendered photosensitive by adding particular photosensitizing substituents to the polyimides. Photosensitivity means the ability to increase the resistance of the polyimide to solvent attack by a developing solvent by exposing it to radiation, particularly ultraviolet radiation. For example, a preferred photosensitive polyimide may be represented by the repeating structural unit:

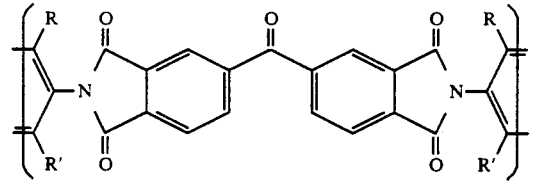

wherein R stands for an aliphatic group, such as methyl, ethyl or isopropyl, and is preferably methyl, and R' represents an optional aliphatic substituent, which may or may not be identical to R. The addition of R' can enhance photospeed and increase the $T_g$-value of the polymer. The photosensitivity of these polyimides is governed essentially by three factors:

1. The position of the alkyl substituent relative to the amino group, substitution in the ortho-position causes much higher photosensitivities than substitution in the meta-position.

2. The total number of ortho-substituents; photosensitivity increases with the number of substitutions.

3. The chemical nature of the ortho-substituent; the photosensitivity increasing according to the progression methyl<ethyl<isopropyl. Although the benzophenone-moiety is known for its photosensitizing properties in a variety of chemical systems, it is not understood how photocrosslinking between this grouping and neighboring polyimide chains occurs.

The photosensitive polyimides useful in the present invention are inherently photosensitive, that is, they do nor require the separate photosensitizer additives found in dielectric compositions based on polyamic acid precursors. The unexposed photosensitive polyimides are initially susceptible to attack by developing solvents used in the photolightographic pattering art, such as gamma-butyrolactone, cyclopentanone, cyclohexanone and the like. The resistance of the photosensitive polyimide to attack by the developing solvents can be increased by irradiating the polyimides with ultraviolet radiation. Examples of these types of photosensitive polymiides are commercially available under the trademark PROBIMIDE TM 400 series from Ciba-Geigy Corporation.

The use of separate photosensitizer compounds has been found undesirable in the microelectronic industry for several reasons. First, many photosensitizers compounds exhibit chemical reactivity with conductive materials, such as copper, which are often covered with the dielectric composition containing the photosensitizers. The chemical interaction adversely affects the photosensitivity of the polyimide film which results in an inability to effectively fabricate fine geometry features. Also, cross-linking between the photosensitizer molecules and the polyamic acid based precursor molecules impedes the solvent desorption rate, thus necessitating a higher temperature bake (e.g, greater than 350° C.) to remove the solvent. As previously discussed, normally a polyimide that has been baked at such elevated temperatures cannot be photolithtographically patterned because the elevated temperatures render it resistant to attack by the developing solvent; therefore, in order to effectively photopattern the polyimide, the high temperature bake must occur after the polyimide has been photopatterned. However, desorbing the solvent at these high temperatures after the photopatterning step caused distortions due to shrinkage and interdiffusion of adjacent metal layers into intermetallic, brittle alloys which do not provide satisfactory conductor lines when electroplated.

In producing integrated circuits or high density interconnect structures using the present invention, the conventional conductor seed patterns which initially define the circuitry within the particular microelectronic device must be electroplated to provide the final conductor line pattern. Any of the conventional methods of providing the conductor seed pattern can be used with the present invention, an example of such method includes the steps of first depositing a very thin (up to 2,599 angstroms) metal seed layer (e.g., a 500 Å adhesion layer of titanium coated a 200 Å layer of gold) onto a silicon wafer. The deposited seed layer is then patterned with a conventional photoresist composition. The portions of the seed layer that are not covered by the resist mask are etched to remove the uncovered portions of the seed layer, thus defining the conductor seed patterns. Thereafter, the photoresist is removed by contacting it with a solvent.

In order to electroplate the conductor seed pattern, it is simpler and more efficient to electrically connect all the conductor seed lines so they can be treated as a single electrode and connected to a voltage source using a single connection. The method of electrically connecting the conductor seed lines must be such that after the electroplating step, the electroplated conductor seed lines can be electrically disconnected to provide the desired isolated circuitry. One means of electrically connecting the conductor seed lines includes providing a conductive film between unconnected conductor seed lines. Reference is made to U.S. Pat. No. 4,661,214, which is incorporated herein by reference, and disclosed exemplary methods of providing conductive films between adajcent conductor lines. The particular conductive film which is used to connect the adjacent conductor seed lines must be capable of being rendered electrically nonconductive. For instance, in the '214 patent, the conductive film can be rendered nonconductive by exposure to temperatures above about 250° C. Therefore, when conductive films similar to those disclosed in the '214 patent are used, the conductor seed lines and conductive film should not be exposed to temperatures in excess of about 250° C. prior to the electroplating step otherwise, the conductive film will become nonconductive and result in some of the conductor seed lines being electrically isolated from other lines. Therefore, a maximum temperature of 250° C. for the intermediate baking step is preferred in order to prevent the conductive films 24 in FIGS. 1a–1e) from becoming nonconductors prior to the electroplating step. Without the electrical connections, the isolated lines will not be electroplated when the voltage is applied and the pattern is placed in the plating bath. The preferred temperatures may be increased in the intermediate baking step if other connection means, whose conductive properties are unaffected by the elevated baking temperatures are used to electrically connect the conductor seed lines. In any case, the temperature of the intermediate baking step should normally not exceed about 350° C., because extended baking at temperatures in excess of 350° C. result in physical distortions of the patterned dielectric and alloying of the heat sensitive metal layers constituting the conductor seed lines.

It is to be understood that modifications and changes to the preferred embodiment of the invention hereindescribed and shown can be made without departing from the spirit and scope of the invention. For instance, the photolightograhpic patterning of the layer of the dielectric composition may be useful in applications, other than the electroplating of conductor seed lines in microelectronics devices. The following examples are set forth to illustrate the invention. However, the examples are not intended as limitations thereof.

EXAMPLE 1

Figure 3:
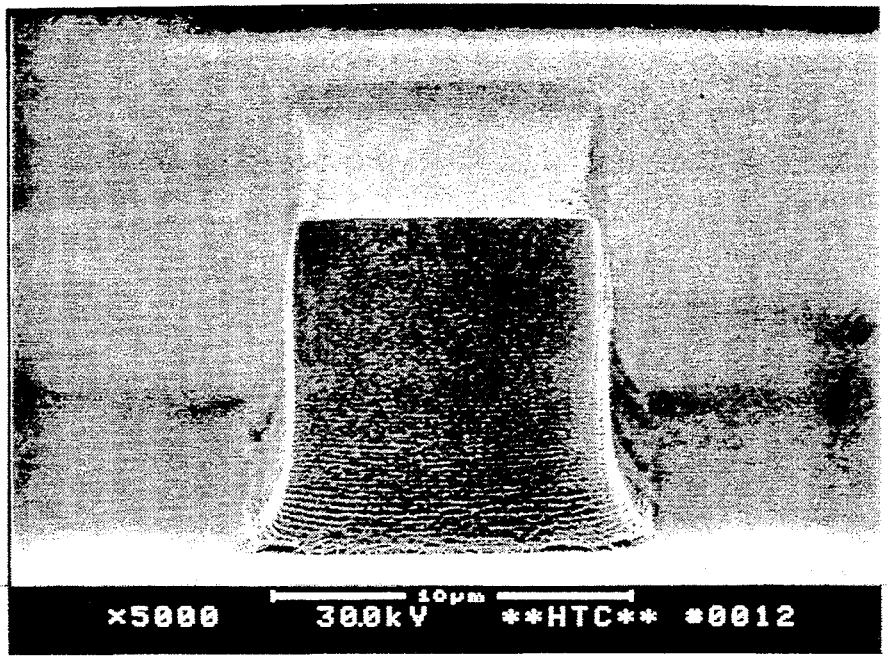
FIG. 3 is a scanning electron micrograph (X5000) of a layer of a photosensitive polyimide dielectric composition photolithographically patterned in accordance with the present invention.

A photosensitive polyimide available from Ciba Geigy Corp. under the trade name PROBIMIDE TM 412 is first spread onto a 7.6 cm diameter silicon wafer by spinning the wafer at 1000 rpm for 10 seconds. The wafer is then spun at 1500 rpm for 30 seconds to complete the coating and provide a layer having an initial thickness of at least 25.0 microns as spun. The layer is heated to 110° C. for 45 minutes to desorb solvent and shrink the polyimide layer to an intermediate thickness of 10.4 microns as measured after the photopatterning step. In the photopatterning step the layer is exposed through a mask to a 1.0 Joule/$cm^2$ dose of ultraviolet radiation (measured at 365 nanomters) having wavelengths of 365 and 406 nanometers. The unexposed portions of the layer are then removed by contacting them with gamma-butyrolactone during an ultrasonic agitation based developing process. The resulting patterned polyimide feature having a line width of 10.0 microns is then heated to 250° C. for 90 minutes in order to drive off the remaining solvent from the photopatterned polyimide to give a layer having a final thickness of 8.7 microns. Referring to FIG. 3, a scanning election micrograph of a vertical cross section of the structure shows a substantially vertical wall profile without any signs of distortion due to shrinkage.

Figure 4:
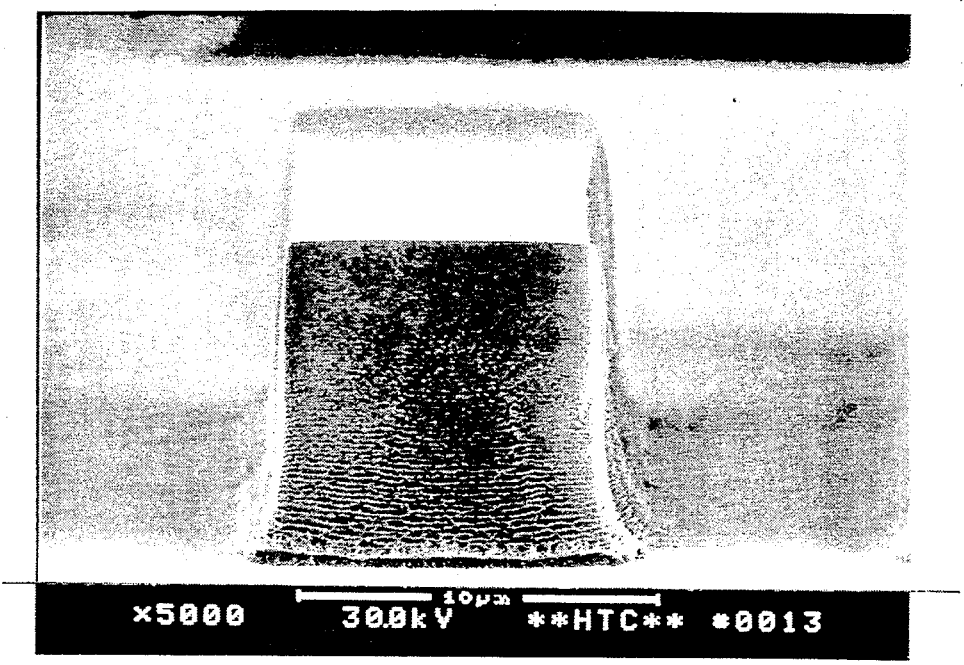
FIG. 4 is a scanning electron micrograph (X5000) of a layer of a photosensitive polyimide dielectric composition photolithographically patterned in accordance with the present invention.

A patterned polyimide layer prepared as described above is heated to 400° C. for 60 minutes to complete the cross-linking of the polyimide and render it resistant to solvent attack by most solvents. FIG. 4 is a scanning electron micrograph of the patterned layer after the 400° C. bake. As illustrated in comparing FIG. 3 and FIG. 4, the 400° C. bake does not cause any substantial shrinkage or distortion to the structure that has been heated to 250° C.

EXAMPLE 2

Features of the photosensitive polyimide having a line width of 12 and 25 microns are photolithtographically patterned on the surface of a silicon wafer in accordance with Example 1. After the 250° C. bake, the maximum and minimum line widths of the feature are determined from a scanning electron micrograph of the vertical cross section of the respective features. The patterned feature is then baked for 60 minutes at 400° C. and the maximum and minimum line widths are again determined from a scanning electron micrograph.

Figure 5:
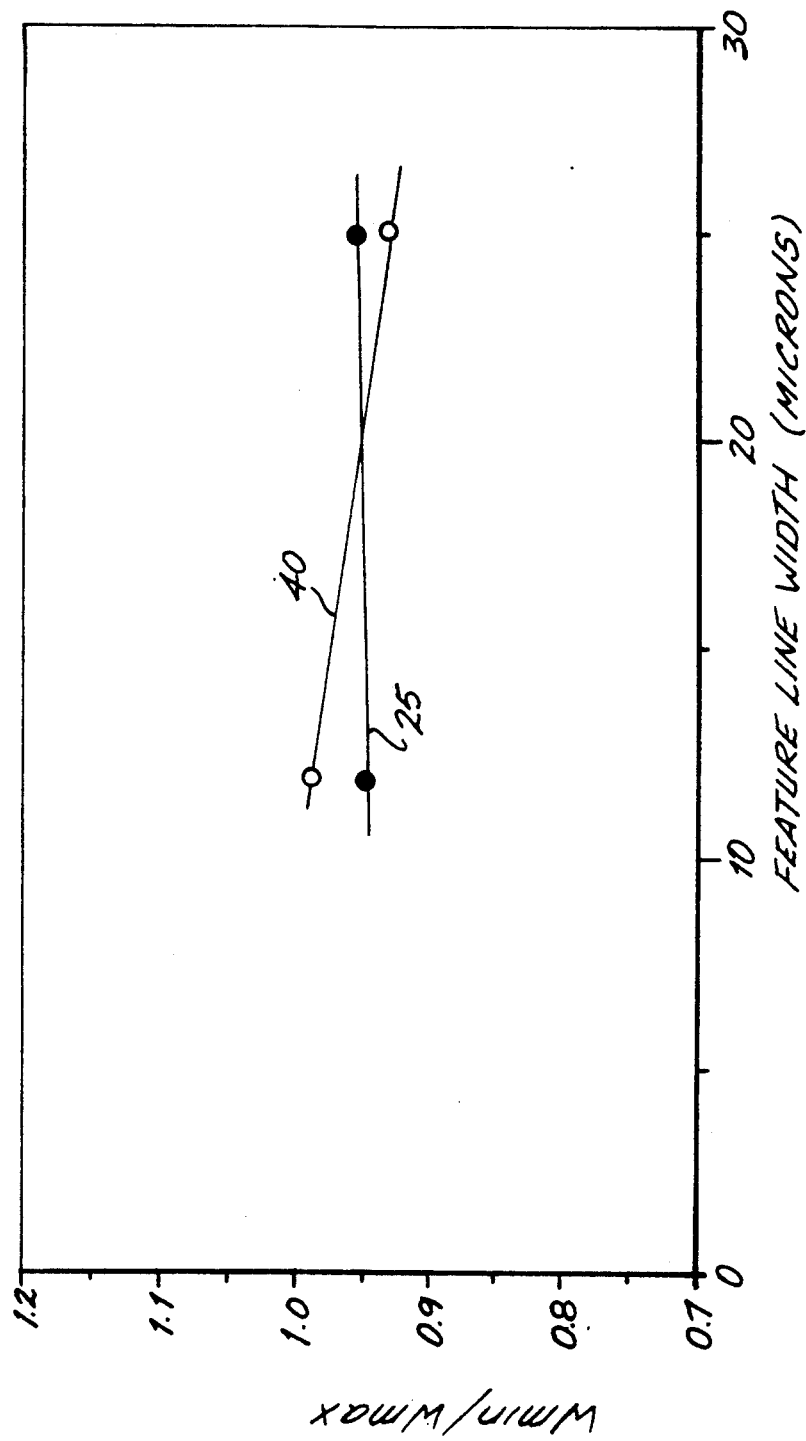
FIG. 5 graphically illustrates the ratio of minimum line width to maximum line width as a function of the feature size.

Referring to FIG. 5, the ratio of the minimum line width ($W_{min}$) to the maximum line width ($W_{max}$) are plotted on the y-axis, with the average feature line width plotted on the xi-axis. Line 25 represents $W_{min}/W_{max}$ after the 250° C. bake and line 40 represents $W_{min}/W_{max}$ after the 400° C. baking step. A ratio of $W_{min}/W_{max}$ of 1.0 corresponds to a feature having a vertical wall profile. FIG. 5 shows that the present invention provides features having $W_{min}/W_{max}$ ratios close to 1.0, indicating that the walls of the features are substantially vertical.

The present invention is a method for providing a photolithographically patterned layer of a dielectric composition, including a photosensitive polyimide and a solvent, having vertical wall profiles that does nor require high temperature baking steps (e.g, greater than 250° C.). The method of the present invention does nor require the use of a diffusion barrier to prevent chemical interaction between the photosensitive polyimide layer and the metal layer over which the polyimide layer is coated. Also, the method of the present invention provides a dielectic layer that has light absorption characteristics in the visible range that allow the use of visible laser techniques to disconnect conductor lines or repair defects. Further, the dielectric structures provided by the method of the present invention do not suffer from distortions normally associated with shrinkage of the dielectric composition after being exposed to the patterning ultraviolet radiation.

The present invention has been described in relation to various embodiments, including the preferred applications and parameters. One or ordinary skill, after reading the foregoing specification, will be to effect various changes, substitutions of equivalents, and other alterations without departing from the broad concepts disclosed herein. It is therefore intended that the scope of Letters Patent granted hereon will be limited only by the definition contained in the appended claims and equivalents thereof.

The embodiments of the invention in which an exclusive property or privilege is claimed are defined as follows:

1. A process for photolithtograhically patterning a layer of a dielectric composition having an initial thickness to provide a dielectric feature having a final thickness, the dielectric composition having a photosensitive polyimide and a solvent, the process consisting of the steps:
   (a) heating the layer to a primary temperature ranging from about 100° C. to 130° C. effective to decrease the initial thickness of the layer by a first amount to an intermediate thickness;
   (b) exposing the portions of the layer of intermediate thickness to radiation;
   (c) removing the exposed portions of the layer;
   (d) heating the exposed portions of the layer to a secondary temperature ranging between about 200° C. to 300° C. effective to decrease the intermediate thickness of the layer by a second amount to a final thickness, the first amount being greater than the second amount; and
   (e) curing the layer from step (d) bu heating it to a third temperature ranging between about 350° C. to about 420° C., substantially no decrease in the thickness of the layer occurring during this step.

2. The process of claim 1 wherein step (c) further comprises:
   contacting said layer with a developing solvent, said developing solvent being selected such that the unexposed portions of said layer are removed by contact with said developing solvent and said exposed portions remain after being contacted with said developing solvent.

3. The process of claim 1, wherein the radiation is ultraviolet radiation.

4. The process of claim 2, wherein the intermediate thickness of the layer after step (a) is such that the exposed portions are uniformly irradiated by the ultraviolet radiation, said uniform irradiation increasing the resistance of the exposed portions to adjacent attack by the developing solvent uniformly throughout the layer, such that the exposed portions, after removal of the unexposed portions, have walls that are substantially vertical.

5. The process of claim 1, wherein the first amount is at least about 80 percent of the difference between the initial thickness and the final thickness of the layer.

6. The process of claim 1, wherein the photosensitive polyimide comprises the repeating structural unit represented by the formula:

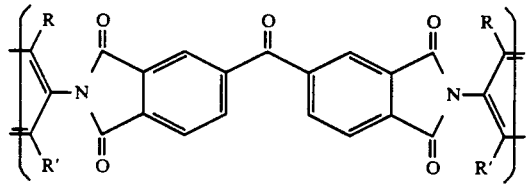

wherein R is an aliphatic group and R' is an aliphatic group.

7. The process of claim 1 wherein the photosensitive polyimide is an inherently photosensitive polyimide.

8. A process for electroplating over a conductor seed pattern consisting essentially of the steps:

(a) applying a layer of a dielectric composition, having an initial thickness, over said conductor seed pattern, said dielectric composition comprising a photosensitive polyimide and a solvent;
(b) heating the layer to a primary temperature ranging from about 100° C. to 130° C. effective to decrease the initial thickness of the layer by a first amount to an intermediate thickness;
(c) photolithographically patterning the layer of intermediate thickness such that portions of the conductor seed pattern to be electroplated are uncovered;
(d) heating the photolithographically patterned layer to a secondary temperature ranging between about 200° C. to 300° C. effective to decrease the intermediate thickness of the layer by a second amount to a final thickness, the first amount being greater than the second amount, the layer of final thickness being substantially free of solvent;
(e) subjecting the uncovered conductor seed pattern to electroplating conditions; and
(f) heating the photolithographically patterned layer to a third temperature ranging between about 350° C. to about 420° C. effective to cure the photosensitive polyimide of the photolithographically patterned layer, substantially no decrease in the thickness of the layer occurring in this step.

9. The process of claim 8, wherein the photolithographic patterning of the layer of the dielectric composition in step (c) further comprises the steps:
(i) irradiating the layer with untraviolet radiation through a mask such that a portion of the layer is exposed to the ultraviolet radiation; and
(ii) contacting said layer with a developing solvent, said developing solvent being selected such that the unexposed portions of said layer are removed by contact with said developing solvent and said exposed portions remain after being contacted with said developing solvent.

10. The process of claim 8, wherein the first amount is at least about 80 percent of the difference between the initial thickness and the final thickness of the layer.

11. A high density multilayer interconnect structure prepared by the process of claim 8.

12. The process of claim 8, wherein the conductor seed pattern of step (a) comprises discontinuous conductor lines electrically interconnected by a conductive film, said conductive film providing an electrical connection until being exposed to an elevated temperature, said exposure to the elevated temperature disconnecting the electrical connection provided by the conductive film.

13. The process of claim 12, wherein the electrical connection provided by the conductive film is maintained after step (b).

14. The process of claim 12, wherein the electrical connection provided by the conductive film is maintained after step (d).

15. The process of claim 12, wherein the conductive film is heated by a laser beam.

16. The process of claim 8, wherein the photosensitive polyimide is an inherently photosensitive polyimide.

17. The process of claim 1, wherein the secondary temperature is less than 350° C.

18. A process for electroplating over a conductor seed pattern consisting essentially of the steps:
(a) applying a layer of a dielectric composition, having an initial thickness, over said conductor seed pattern, said dielectric composition comprising a photosensitive polyimide and a solvent, said conductor seed pattern comprising gold;
(b) heating the layer to a primary temperature ranging from about 100° C. to 130° C. effective to decrease the initial thickness of the layer by a first amount to an intermediate thickness;
(c) photolithographically patterning the layer of intermediate thickness such that portions of the conductor seed pattern to be electroplated are uncovered;
(d) heating the photolithographically patterned layer to a secondary temperature ranging between about 200° C. to 300° C. effective to decrease the intermediate thickness of the layer by a second amount to a final thickness, the first amount being greater than the second amount, the layer of final thickness being substantially free of the solvent;
(e) subjecting the uncovered conductor seed pattern to electroplating conditions; and
(f) heating the photolithographically patterned layer to a third temperature ranging between about 350° C. to about 420° C. effective to cure the photosensitive polyimide of the polylithographically patterned layer, substantially no decrease in thickness of the layer occurring in this step.

* * * * *

UNITED STATES PATENT AND TRADEMARK OFFICE
CERTIFICATE OF CORRECTION

PATENT NO. : 5,124,238

DATED : June 23, 1992

INVENTOR(S) : K.K. Chakravorty et al.

Page 1 of 2

It is certified that error appears in the above-identified patent and that said Letters Patent is hereby corrected as shown below:

| COLUMN | LINE | ERROR |
| --- | --- | --- |
| 1 | 49 | "photographically" should read --photolithographically-- |
| 2 | 30 | "its" should read --it-- |
| 2 | 31 | "attach" should read --attack-- |
| 5 | 7 | after "and" insert --the-- |
| 5 | 36 | after "of" insert --the-- |
| 7 | 14 | "the" (second occurrence) should read --this-- |
| 7 | 56 | after "alloying" insert --of adjacent-- |
| 9 | 6 | "nor" should read --not-- |
| 9 | 10 | "photolightographic" should read --photolithographic-- |
| 9 | 10 | "pattering" should read --patterning-- |
| 9 | 16 | "polymiides" should read --polyimides-- |
| 9 | 19 | after "of" insert --the-- |
| 9 | 34 | "photolithtographically" should read --photolithographically-- |
| 9 | 41 | "caused" should read --causes-- |
| 9 | 54 | "2,599" should read --2,500-- |
| 9 | 55 | "200" should read --2000-- |
| 10 | 9 | "adajcent" should read --adjacent-- |
| 10 | 24 | "in" should read --(in-- |
| 10 | 43 | "photolightograhpic" should read --photolithographic-- |
| 10 | 63 | "nanomters" should read --nanometers-- |
| 11 | 20 & 21 | "photolithtograph-ically" should read --photolithographically-- |
| 11 | 32 | "xi-axis" should read --x-axis-- |
| 11 | 44 | "nor" should read --not-- |
| 11 | 46 | "nor" should read --not-- |

UNITED STATES PATENT AND TRADEMARK OFFICE
CERTIFICATE OF CORRECTION

PATENT NO. : 5,124,238
DATED : June 23, 1992
INVENTOR(S) : K.K. Chakravorty et al.

It is certified that error appears in the above-identified patent and that said Letters Patent is hereby corrected as shown below:

| COLUMN | LINE | ERROR |
|---|---|---|
| 11 | 62 | after "be" insert --able-- |
| 12<br>(Claim 1, Line 1) | 4 | "photolithtographically" should read --photolithographically-- |
| 12<br>(Claim 1, Line 13) | 16 | "exposed" should read --unexposed-- |
| 12<br>(Claim 1, Line 20) | 23 | "bu" should read --by-- |
| 12<br>(Claim 4, Line 5) | 42 | "adjacent" should read --solvent-- |
| 14<br>(Claim 18, Line 28) | 45 | "polylithographically" should read --photolithographically-- |

Signed and Sealed this

Third Day of August, 1993

Attest:

MICHAEL K. KIRK

Attesting Officer     Acting Commissioner of Patents and Trademarks